United States Patent
Nakabayashi

(10) Patent No.: US 8,243,948 B2
(45) Date of Patent: Aug. 14, 2012

(54) SELECTOR AND AMPLIFIER DEVICE THEREFOR

(75) Inventor: Kotaro Nakabayashi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1050 days.

(21) Appl. No.: 12/112,498

(22) Filed: Apr. 30, 2008

(65) Prior Publication Data
US 2008/0273710 A1 Nov. 6, 2008

(30) Foreign Application Priority Data
May 2, 2007 (JP) .................................. 2007-121876

(51) Int. Cl.
H04B 3/00 (2006.01)
(52) U.S. Cl. ............... 381/81; 381/80; 381/106; 381/61
(58) Field of Classification Search .................... 381/80, 381/81, 106, 13, 61, 57, 94.3
See application file for complete search history.

(56) References Cited

U.S. PATENT DOCUMENTS

| | | | |
|---|---|---|---|
| 4,641,344 A * | 2/1987 | Kasai et al. | 381/57 |
| 4,996,597 A * | 2/1991 | Duffield | 348/705 |
| 5,065,432 A * | 11/1991 | Sasaki et al. | 381/61 |
| 5,398,286 A * | 3/1995 | Balestri et al. | 381/94.3 |
| 5,812,673 A * | 9/1998 | Nohara et al. | 381/13 |
| 6,529,680 B1 * | 3/2003 | Broberg | 386/200 |

FOREIGN PATENT DOCUMENTS

JP 2000-339840 A 12/2000

* cited by examiner

*Primary Examiner* — Thinh T Nguyen
(74) *Attorney, Agent, or Firm* — Crowell & Moring LLP

(57) ABSTRACT

An amplifier device includes a plurality of input terminals for receiving input signals (e.g. audio signals), a main switch, which switches over the input terminals so as to select one input terminal, an analyzer, which analyzes the input signals at respective timings so as to determine whether or not each of the input signals corresponds to a playback signal, a storage for storing a plurality of determination results in connection with the input terminals, a controller for controlling the main switch to select the input terminal whose input signal is newly determined as the playback signal, and an amplifier for amplifying the input signal of the selected input terminal. The analyzer performs frequency analysis on the input signals so as to determine the input signal including a specific frequency component having a high intensity as noise not forming the playback signal.

13 Claims, 7 Drawing Sheets

SELECTOR AND AMPLIFIER DEVICE THEREFOR

BACKGROUND OF THE INVENTION

1. Field of the Invention

The present invention relates to selectors for selecting audio signals output from multiple audio devices. The present invention also relates to amplifier devices for amplifying audio signals selected by selectors.

The present application claims priority on Japanese Patent Application No. 2007-121876, the content of which is incorporated herein by reference.

2. Description of the Related Art

Conventionally, audio amplifiers have been connected to various types of audio devices such as CD players, CD-DA (i.e. Compact Disk Digital Audio) players, DVD (i.e. Digital Versatile Disk) players, television receivers, radio receivers, broadcast receivers, and tuners, in which audio signals are appropriately selected and amplified. Users press playback buttons of audio devices so as to issue playback instructions, and they also operate input select controls (e.g. input select dials and remote control buttons) so as to selectively activate audio devices receiving playback instructions.

When users intend to listen to desired audio contents, it is necessary for users to perform troublesome operations for specifically selecting audio devices and audio amplifiers.

Some audio devices are designed to output audio signals together with control signals indicating present statuses of audio devices (e.g. playback modes and stop modes). Some audio amplifiers are designed to recognize control signals output from audio devices, thus avoiding troublesome manual operations by users. Various documents such as Patent Document 1 teach various types of audio amplifiers having the aforementioned functions.

Patent Document 1: Japanese Unexamined Patent Application Publication No. 2000-339840.

The audio amplifier of Patent Document 1 needs control signals other than audio signals in order to automatically select desired audio signals suited to user's preference; hence, it cannot handle other audio devices incapable of outputting control signals.

SUMMARY OF THE INVENTION

It is an object of the present invention to provide a selector for automatically selecting a desired input terminal upon detection of a playback status of an audio device based on audio signals output from the audio device.

It is another object of the present invention to provide an amplifier device for appropriately amplifying audio signals selected by the selector.

In a first aspect of the present invention, a selector includes a plurality of input terminals for receiving input signals (e.g. audio signals), a main switch, which switches over the input terminals so as to select one input terminal, an analyzer, which analyzes the input signals at respective timings so as to determine whether or not each of the input signals corresponds to a playback signal, a storage for storing a plurality of determination results in connection with the input terminals, and a controller, which compares the present determination result with the preceding determination result so that when the present determination result differs from the preceding determination result, it indicates the input terminal whose input signal is newly determined as the playback signal, and the main switch is controlled to select the input terminal.

Preferably, the analyzer performs frequency analysis on the input signals, so that the input signal including a specific frequency component having a high intensity is not determined as the playback signal and is regarded as noise.

Preferably, it is possible to further introduce a display for displaying the determination results with respect to the input terminals with reference to the storage under control of the controller, wherein the display shows a distinction with respect to the input terminal whose input signal is not determined as the playback signal.

Preferably, it is possible to further introduce a plurality of delays for delaying the input signals with respect to the plurality of input terminals in the main switch.

In a second aspect of the present invention, an amplifier device includes the aforementioned selector and an amplifier for amplifying the selected input signal. When the selector is connected to a plurality of audio devices, it selects audio signals of a desired audio device presently subjected to playback in progress. That is, the selector can automatically select audio signals suited to a user's preference, and the controller controls the display to show audio devices presently subjected to playback in progress.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

The present invention will be described in further detail by way of examples with reference to the accompanying drawings.

1. Constitution

Figure 1:
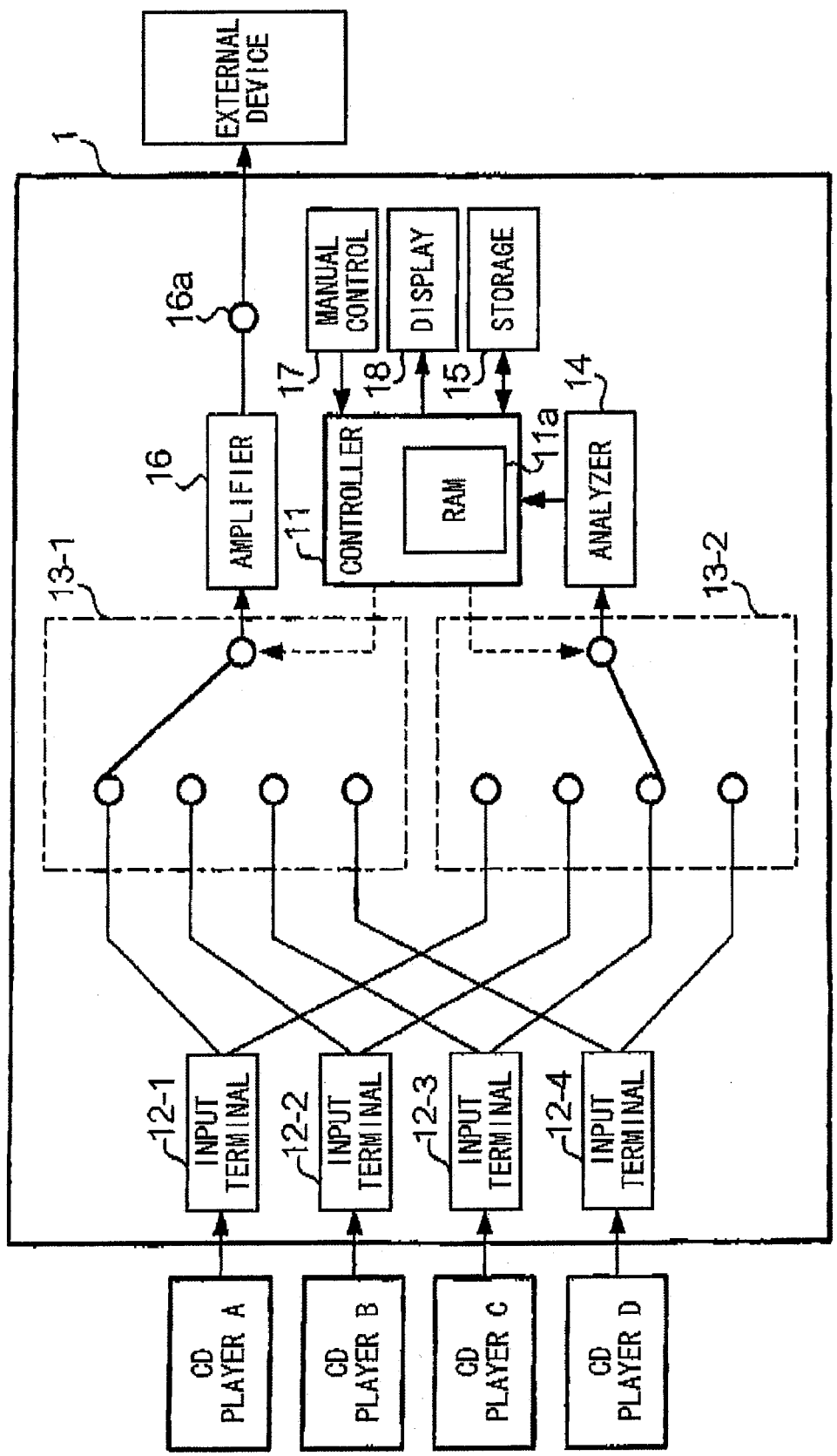
FIG. 1 is a block diagram showing the constitution of an amplifier device in accordance with a preferred embodiment of the present invention.

FIG. 1 is a block diagram showing the constitution of an amplifier device 1 in accordance with a preferred embodiment of the present invention. The amplifier device 1 includes a controller 11, which further includes a CPU (not shown) and a RAM 11a. The CPU reads and executes control programs (stored in memory) by way of an arithmetic and logic unit (ALU) and the like, thus controlling various sections of the amplifier 1. The RAM 11a serves as a work area for temporarily storing and processing various data by the controller 11.

The controller 11 includes a timer (not shown) having an oscillator using a quartz oscillator (not shown), wherein it divides frequencies of oscillation signals (output from the oscillator) so as to generate clock signals, based on which time is measured.

The amplifier device 1 includes input terminals 12-1 to 12-4, which are connected to CD players A to D (which are not necessarily restricted; hence, which can be referred to as other types of audio devices such as MD players). The input terminals 12-1 to 12-4 are connected to four input terminals of a main switch 13-1 and four terminals of an auxiliary switch 13-2 respectively.

Each of the main switch 13-1 and the auxiliary switch 13-2 is constituted of switching elements (not shown), which are connected between input/output terminals thereof, wherein any one of input terminals is connected to the output terminal. The controller 11 supplies a switching signal for selecting any one of four input terminals of the main switch 13-1, which thus selects one input terminal thereof. The controller 11 includes a timer (not shown), which supplies switching signals to the auxiliary switch 13-2 so as to periodically select the input terminals 12-1 to 12-4 in turn in units of 100 msec, for example. Thus, the auxiliary switch 13-2 periodically switches over the input terminals 12-1 to 12-4 so as to output a signal Sa via the output terminal thereof.

The analyzer 14 performs frequency analysis on the signal Sa output from the auxiliary switch 13-2 so as to determine whether or not the signal Sa corresponds to audio signals output from any one of the CD players A to D. The analyzer 14 is configured of a digital signal processor (DSP), for example. When the auxiliary switch 13-2 selects one of the input terminals 12-1 to 12-4, it performs frequency analysis on the signal Sa given from the selected input terminal so as to produce a playback signal or a non-playback signal representing the analysis result, which is then supplied to the controller 11.

Figure 2:
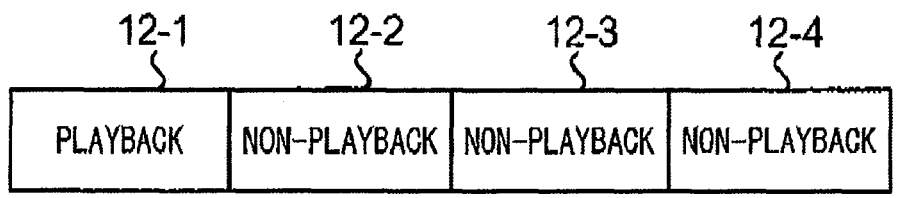
FIG. 2 shows an example of the stored content of a RAM included in a controller of the amplifier device shown in FIG. 1.

Based on the analysis result of the analyzer 14 and the switching signal supplied to the auxiliary switch 13-2, the controller 11 determines whether or not any one of the CD players A to D connected to the input terminals 12-1 to 12-4 performs playback in progress. Since the controller 11 generates and outputs a specific switching signal to the auxiliary switch 13-2, it can recognize which of the input terminals 12-1 to 12-4 be presently selected. By recognizing the analysis result, which is either the playback signal or non-playback signal, the analyzer 14 makes a playback/non-playback decision with respect to the CD players A to D connected to the input terminals 12-1 to 12-4. Then, results of the playback/non-playback decision are stored in the RAM 11a of the controller 11 in correspondence with the input terminals 12-1 to 12-4. FIG. 2 shows an example of the stored content of the RAM 11a, in which playback statuses or non-playback statuses are described with respect to the input switches 12-1 to 12-4.

A storage 15 is a large-scale storage such as hard disks, which store control programs and other pieces of necessary information.

An amplifier 16 includes a D/A converter and an amplifier (not shown), which receive digital audio signals output from the main switch 13-1 so as to amplify and convert them into analog audio signals, which are further subjected to various sound effects (e.g. echo and equalization). Then, analog audio signals, which are amplified and subjected to sound effects, are output to an external device (e.g. speaker) via an output terminal 16a.

A manual control 17 includes various keys and switches, wherein they output signals responding to depressed keys and the like to the controller 11. A display 18 includes a plurality of light-emitting diodes, which show the present status of the amplifier device 1 in prescribed manners.

2. Operation

First, the user inserts a CD into any one of CD players A to D, all of which are presently stopped in operation and which are connected to the amplifier device 1.

The following description is given with respect to the CD player A, into which the user inserts a CD.

When the user presses a play button (not shown) of the CD player A, it reads digital audio signals recorded on the CD so as to output them to the input terminal 12-1. Digital audio signals input to the input terminal 12-1 are delivered to the main switch 13-1 and the auxiliary switch 13-2.

As described above, the auxiliary switch 13-2 periodically switches over the input terminals 12-1 to 12-4 connected thereto under the control of the controller 11 in units of 100 msec. The analyzer 14 performs frequency analysis on digital audio signals, which are selected and output from the auxiliary switch 13-2, so as to detect the playback status. Then, the analyzer 14 outputs the analysis result to the controller 11.

Figure 3:
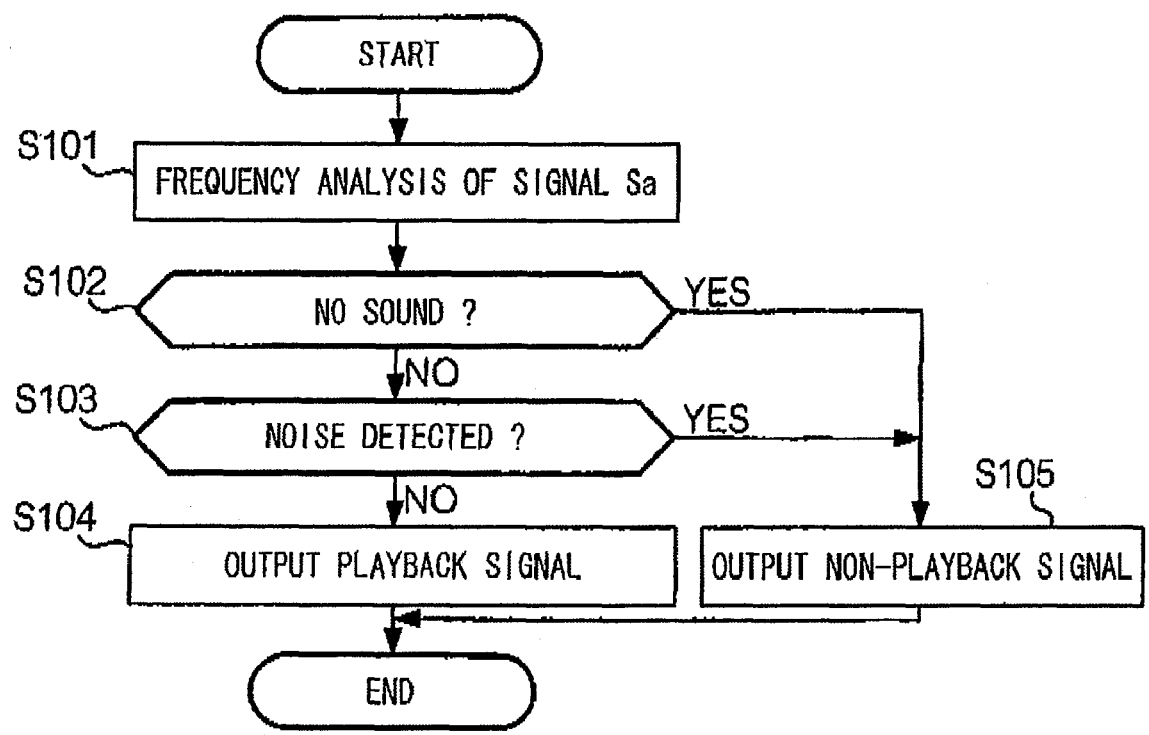
FIG. 3 is a flowchart showing a playback status detection process executed by an analyzer included in the amplifier device shown in FIG. 1.

Next, a playback status detection process will be described with reference to FIG. 3, FIG. 3 is a flowchart showing the playback status detection process executed by the analyzer 14. In step S101, the analyzer 14 performs frequency analysis on the signal Sa output from the auxiliary switch 13-2. In step S102, the analyzer 14 detects whether the signal Sa indicates a sound mode or a silent mode based on its level. In the present embodiment, the analyzer 14 detects the silent mode when the signal Sa is lower than a prescribed threshold. Upon detection of the silent mode (i.e. the decision result "YES" in step S102) indicating that the signal Sa does not correspond to a playback signal, the flow proceeds to step S105 in which the analyzer 14 outputs the analysis result (i.e. a non-playback signal) to the controller 11.

When the analyzer 14 detects the sound mode (i.e. the decision result "NO" in step S102), the flow proceeds to step S103 in which it performs noise detection based on the result of the frequency analysis. The analyzer 14 performs noise detection in step S103 because, due to hamming noise or oscillation noise being unexpectedly incorporated into the signal Sa, the signal Sa may exceed the threshold unless no playback signal is output; hence, it is possible to prevent the analyzer 14 from detecting such an error event in which the signal Sa actually having no sound is mistakenly detected as a playback signal.

Any type of algorithm enabling noise detection can be adapted to step S103. For example, when peaks appear in the spectrum of the signal Sa at commercial frequencies (e.g. 50 Hz and 60 Hz) and their integral multiples of frequencies, the analyzer 14 detects the signal Sa as hamming noise. When intense peaks consecutively emerge in prescribed frequency components, the analyzer 14 detects the signal Sa as oscillation noise.

Upon detection of noise (i.e. the decision result "YES" in step S103, the analyzer 14 determines that the signal Sa does not correspond to a playback signal; hence, the analyzer 14 outputs a non-playback signal to the controller 11 in step S105.

When the analyzer 14 detects no noise in step S103 (whose decision result is "NO"), it determines that the signal Sa corresponds to a playback signal; hence, it outputs the playback signal to the controller 11.

When all the CD players A to D are stopped, the signal Sa given from all the input terminals 12-1 to 12-4 indicates a non-playback signal; therefore, the controller 11 stores information in the RAM 11 indicating that all the input terminals 12-1 to 12-4 are each presently placed in a non-playback state.

When the user operates the CD player A so that digital audio signals are supplied to the auxiliary switch 13-2 via the input terminal 12-1, the analyzer 14 outputs the analysis result indicating a playback signal to the controller 11 at the timing when the input terminal 12-1 is selected.

Figure 4:
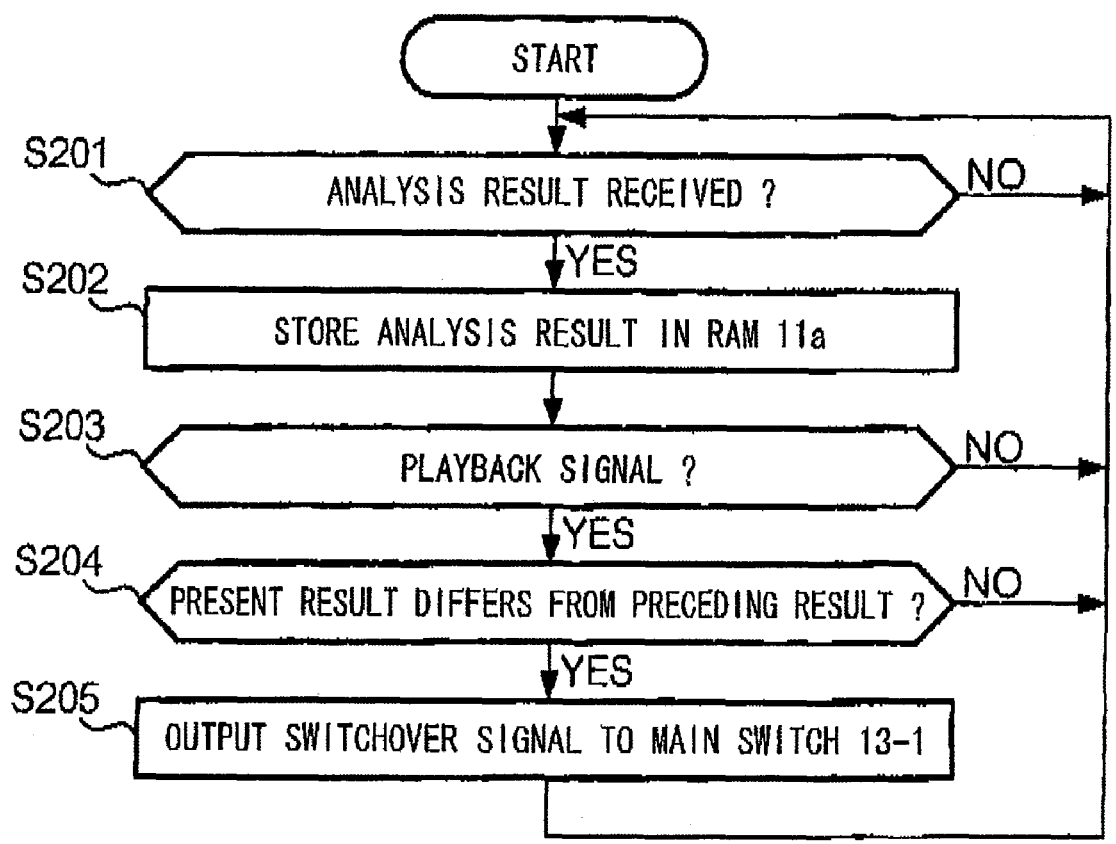
FIG. 4 is a flowchart showing a status change detection process executed by the controller shown in FIG: 1.

Next, the controller 11 performs a status change detection process with respect to the input terminals 12-1 to 12-4. FIG. 4 is a flowchart showing the status change detection process executed by the controller 11. When the controller 11 receives the analysis result from the analyzer 14 at the timing at which the auxiliary switch 13-2 selects the input terminal 12-1, the decision result of step S201 turns to "YES" so that the flow proceeds to step S202 in which the analysis result is stored in tie RAM 11a in connection with the input terminal 12-1. When the analysis result presently stored in the RAM 11a does not correspond to a playback signal so that the decision result of step s203 turns to "NO", the flow proceeds to step S204 in which a decision is made as to whether or not the present analysis result differs from the preceding analysis result. When the present analysis result differs from the preceding analysis result so that the decision result of step S204 turns to "YES", the flow proceeds to step S205. At this time, the controller 11 detects that the signal Sa changes from the non-playback signal to the playback signal, wherein it supplies a switching signal to the main switch 13-1 so as to select the input terminal 12-1.

When the present analysis result corresponds to the preceding analysis result so that the decision result of step S204 is "NO", the flow proceeds back to step S201. In this case, the controller 11 detects that the signal Sa still indicates the playback signal without being changed. That is, the controller 11 monitors the analysis result of the analyzer 14 in step S201.

As described above, when the controller 11 detects that the signal Sa changes firm the non-playback signal to the playback signal, it supplies a switching signal representing such a change to the main switch 13-1.

In the aforementioned operation, the analyzer 14 firstly outputs the analysis result (representing that the signal Sa corresponds to the playback signal) to the controller 11; then, the controller 11 detects that the signal Sa changes from the non-playback signal to the playback signal with respect to the input terminal 12-1; thus, the controller 11 outputs a switching signal to the main switch 13-1 so as to designate the input terminal 12-1. Upon reception of the switching signal, the main switch 13-1 switches over connection to the input terminal 12-1.

As a result, digital audio signals recorded on the CD played back by the CD player A are supplied to the amplifier 16 via the main switch 13-1, wherein they are converted into analog audio signals, which are then output to the external device via the output terminal 16a; thus, the corresponding sound is produced.

Next, when the user inserts another CD into the CD player B and presses its playback button while maintaining the CD player A to play back its CD, digital audio signals read from the CD of the CD player 13 are supplied to the input terminal 12-2. In this case, the analyzer 14 detects that the signal Sa given from the auxiliary switch 13-2 via the input terminal 12-2 also represents a playback signal.

In the above, the analyzer 14 outputs the analysis result representing the playback signal to the controller 11 not only at the timing for selecting the input terminal 12-1 but also at the timing for selecting the input terminal 12-2. Thus, the controller 11 determines the playback status with respect to both the input terminals 12-1 and 12-2, thus storing it in the RAM 11a.

Next, the controller 11 detects status changes based on the analysis result of the analyzer 14 and the stored content of the RAM 11a. In the aforementioned case, the controller 11 detects that the signal Sa changes from the non-playback signal to the playback signal with respect to the input terminal 12-2; hence, it outputs a switching signal to the main switch 13-1 so as to designate the input terminal 12-2. As a result, digital audio signals read from the CD played back by the CD player B are supplied to the amplifier 16 via the main switch 13-1, whereby the recorded content of the CD of the CD player B, which the user operates subsequent to the CD player A, is converted into sound.

As described above, the amplifier device 1 automatically selects digital audio signals reproduced by an audio device, which is placed in a playback state lately. This makes it possible for the user to listen to desired music by simply playing back a desired audio device connected to the amplifier device 1 without actually selecting it. In addition, the amplifier device 1 does not require status signals (representing playback modes and stop modes) from audio devices so as to simply use audio signals only and to automatically select a desired audio device. That is, the amplifier device 1 is adapted to any types of audio devices (capable of outputting audio signals) so as to perform automatic selection of a desired audio device.

3. Variations

The present invention is not necessarily limited to the present embodiment, which can be modified in a variety of ways; hence, variations will be described below.

(1) First Variation

The present embodiment is designed to output a switching signal to the main switch 13-1 when the controller 11 detects once that the signal Sa changes from the non-playback signal to the playback signal. It is possible to modify the present embodiment such that the controller 11 detects that the signal Sa changes from the non-playback signal to the playback signal by counting a prescribed number of times the playback signal occurs or by counting a prescribed time in which the playback signal is continuously detected. For example, when the playback signal is consecutively applied to the amplifier device 1 five times (corresponding to two seconds), the controller 11 detects a change from the non-playback signal to the playback signal. Thus, it is possible to prevent the amplifier device 1 (serving as the selector and amplifier) from automatically selecting an undesired audio device irrespective of temporary occurrence of audio signals of the undesired audio device during a 400 msec period in which the auxiliary switch 13-2 scans the audio devices connected thereto in one cycle.

Some musical tunes may include short silent conditions in order to achieve musical effects; and some CDs storing multiple musical tunes may have silent times ranging from two seconds to four seconds in playback between consecutive musical tunes. When the analyzer 14 analyzes silent times so as to detect non-playback signals, it controls the main switch 13-1 to switch over its input terminals. This may allow the amplifier device 1 to automatically select an undesired audio device not suited to the user's preference.

To cope with the aforementioned situation, the present embodiment can be modified such that the controller 11 detects a change event, in which the signal Sa changes from the playback signal to the non-playback signal, by counting a prescribed number of times the non-playback signal consecutively occurs or by counting a prescribed time the non-playback signal continuously emerges. For example, the controller 11 can recognize the non-playback state when the non-playback signal is consecutively applied to the amplifier device 1 fifteen times (corresponding to six seconds). This reliably prevents the amplifier device 1 from automatically selecting an undesired audio device not suited to the user's preference. The aforementioned number of times (or the prescribed time) can be set to a fixed value; or it can be appropriately set to an arbitrary value by way of a manual control 17.

(2) Second Variation

Figure 5:
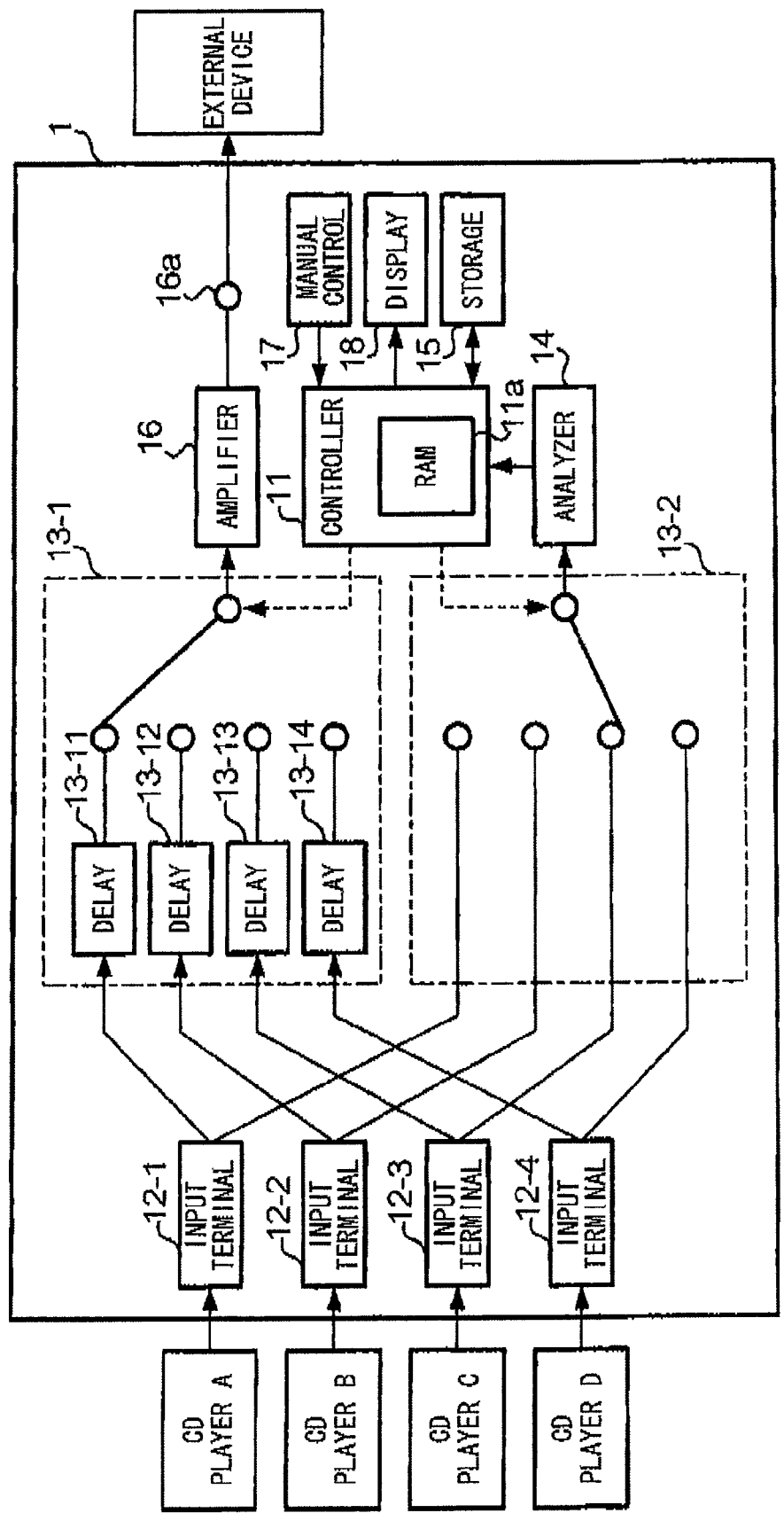
FIG. 5 is a block diagram showing the constitution of an amplifier device according to a second variation.

The present embodiment does not introduce a time difference between the output of the main switch 13-1 and the output of the auxiliary switch 13-2; but this is not a restriction; hence, it is possible to introduce a time difference therebetween. That is, the amplifier device 1 shown in FIG. 1 can be modified as shown in FIG. 5, in which delays 13-11, 13-12, 13-13, and 13-14 are connected to respective input terminals of the main switch 13-1, whereby the output signal of the main switch 13-1 is delayed by a prescribed delay time rather than the signal Sa output from the auxiliary switch 13-2. In FIG. 5, the delays 13-11 to 13-14 are each configured by a buffer memory so as to delay the input signal thereof by a prescribed delay time. Hence, the output signal of the main switch 13-1, which corresponds to any one of the input signals subjected to the delays 13-11 to 13-14, is delayed from the signal Sa output from the auxiliary switch 13-2 by the prescribed delay time.

In the present embodiment, after the analyzer 14 analyzes the signal Sa, the controller 11 sends a switching signal to the main switch 13-1; hence, the switching timing must be delayed by at least the analysis time, whereby it may be unlikely for the user to listen to the top portion of a musical tune being played back. However, the second variation allows the user to normally listen to the top portion of a musical tune. In the first variation, another time (for detecting the status change by way of the prescribed number of times for comparing the signal Sa with the prescribed threshold) in addition to the analysis time may cause a delay in playing back a musical tune. The second variation provides the delays 13-11 to 13-14 so as to appropriately delay audio signals to match the switching operation of the auxiliary switch 13-2 in consideration of the frequency analysis of the analyzer 14; hence, it is possible to appropriately coordinate the timing for producing sound. The delay time can be set to a fixed value, or it can be appropriately set by means of the manual control 17. Alternatively, it is possible to automatically set the delay time to be longer than the threshold that is described in the first variation.

(3) Third Variation

Figure 6:
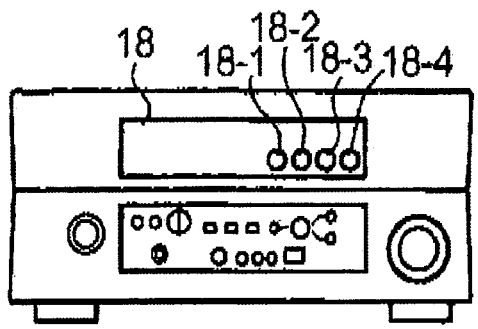
FIG. 6 is an illustration showing the exterior appearance of an amplifier device according to a third variation.

It is possible to modify the present embodiment such that other audio devices, which are not presently selected, are divided into audio devices subjected to playback in progress and audio devices not subjected to playback. FIG. 6 shows the exterior appearance of an amplifier device 1 according to the third variation, wherein the amplifier device 1 having a rectangular parallelepiped shape has a display 18 including multiple LEDs 18-1 to 18-4 arranged on the front surface of a housing thereof. The LEDs 18-1 to 18-4 display present statuses of the input terminals 12-1 to 12-4.

Figure 7:
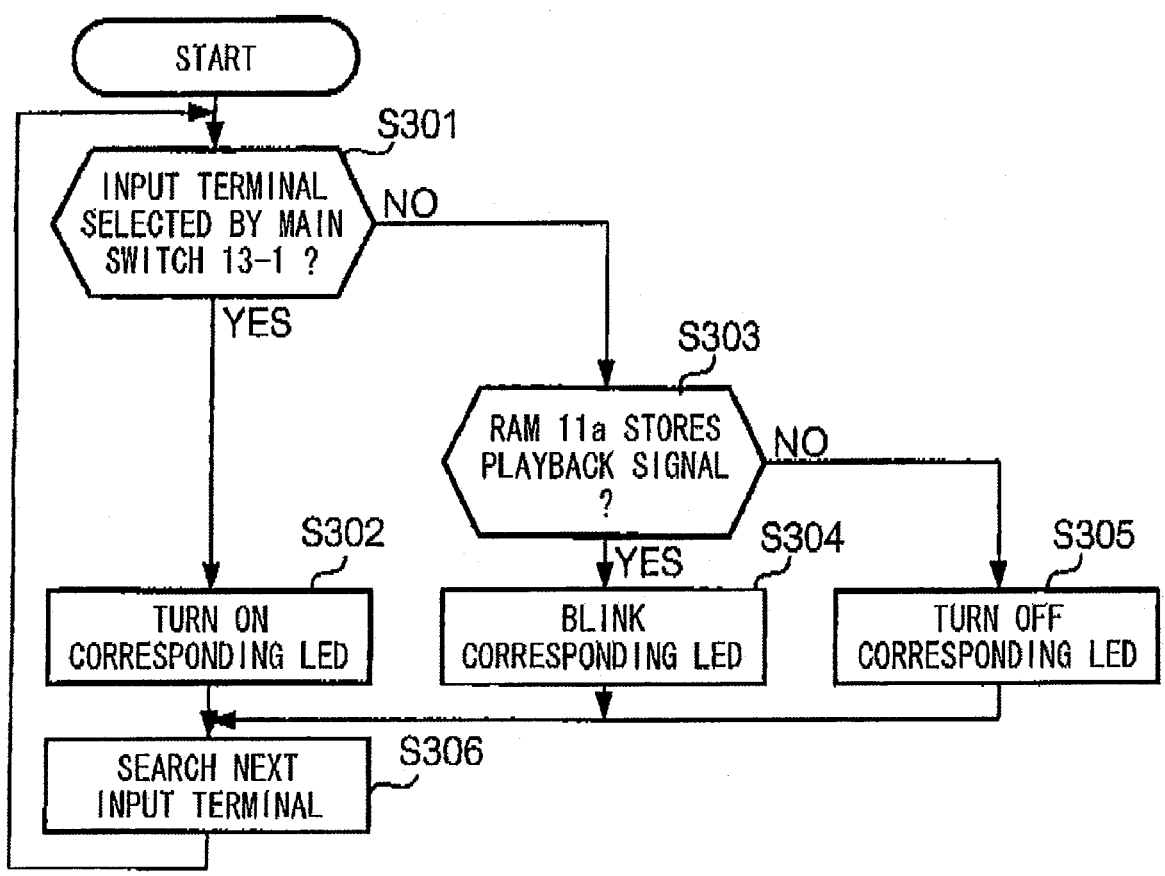
FIG. 7 is a flowchart showing a display process of a display including LEDs shown in FIG. 6.

FIG. 7 is a flowchart showing a display process of the amplifier device 1 according to the third variation. The display process is an interrupt process that is repeatedly activated in each period counted by a time (not shown) incorporated in the controller 11, wherein it is executed substantially in parallel with the status change detection process shown in FIG. 4.

In the display process, the controller 11 sequentially scans the input terminals 12-1, 12-2, 12-3, and 12-4 in each cycle. That is, the following process is performed with respect to the input terminals 12-1 to 12-4.

First, with respect to a certain input terminal that is presently selected by the main switch 13-1 (in which the decision result of step S301 is "YES"), the controller 11 controls the display 18 so as to turn on the LED corresponding to the selected input terminal in step S302. For example, when the main switch 13-1 presently selects the input terminal 12-2, the controller 11 turns on the LED 18-2 in correspondence with the input terminal 12-2. Then, the flow proceeds to step S306 in which the controller 11 scans the next input terminal.

When the input terminal presently detected by the controller 11 does not match the input terminal presently selected by the main switch 13-1 (in which the decision result of step S301 is "NO"), the flow proceeds to step S303 in which the controller 11 makes a decision as to whether or not the signal Sa given from the presently selected input terminal by the main switch 13-1 is a playback signal with reference to the stored content of the RAM 11a. When the signal Sa corresponds to the playback signal (i.e. the decision result of step S303 is "YES"), the flow proceeds to step S304 in which the corresponding LED is turned on and off (or blinks). Suppose that the RAM 11a describes that both the input terminals 12-1 and 12-2 are detected as the playback status but the main switch 13-1 presently selects the input terminal 12-2. In this case, the controller 11 turns on and off (or blinks) the LED 18-1 in correspondence with the input terminal 12-1 by way of the aforementioned process. Then, the controller 11 scans the next input terminal in step S306. When the signal Sa does not correspond to the playback signal (i.e. the decision result of step S303 is "NO"), the flow proceeds to step S305 in which the controller 11 turns off the corresponding LED. Thereafter, the controller 11 scans the next input terminal in step S306.

Figure 8:
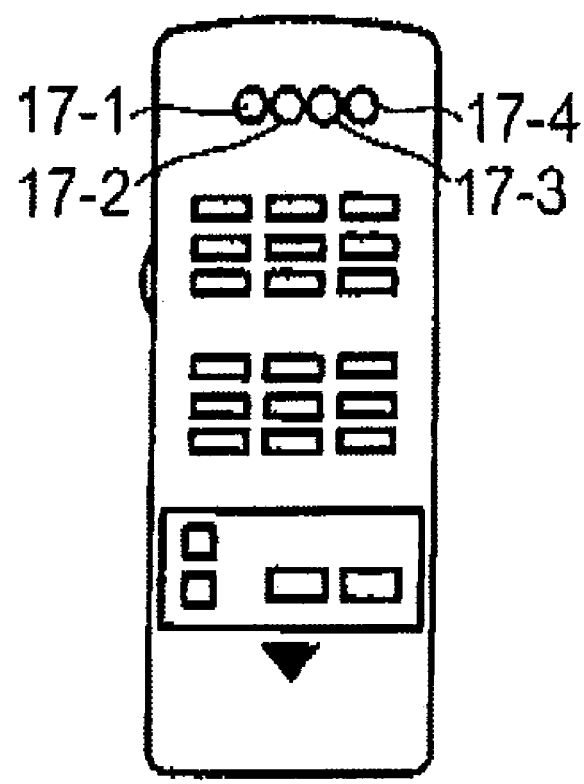
FIG. 8 is an illustration showing the exterior appearance of a manual control adapted to the amplifier device according to the third variation.

The present embodiment is designed such that the manual control 17 is connected to the controller 11 via wire; but this is not a restriction. That is, the manual control 17 is capable of performing wireless communication with the controller 11. FIG. 8 shows the exterior appearance of the manual control 17 according to the third variation, which is a remote controller that sends wireless operation signals to the controller 11. The manual control 17 has buttons 17-1 to 17-4 in correspondence with the input terminal 12-1 to 12-4. After the user confirms that the LED 18-1 blinks in the display 18 (see FIG. 6), the user depresses the corresponding button 17-1 of the manual control 17, which thus sends a signal to the controller 11. The controller 11 sends a switching signal to the main switch 13-1 so as to select the input terminal 12-1. As a result, digital audio signals output from the CD player A connected to the input terminal 12-1 are supplied to the amplifier 16 via the main switch 13-1 and are then output to the external device via the output terminal 16a.

The amplifier device 1 blocks audio signals output from other audio devices not selected; hence, it is difficult for the user to realize they are subjected to playback in progress; this may consume unnecessary electric power. The third variation is designed such that the amplifier device 1 makes a distinction between the audio devices presently subjected to playback in progress and other audio devices not subjected to playback. This allows the user to cut a power supply to other audio devices. It is possible to additionally attach light-emitting diodes to the buttons 17-1 to 17-4 of the manual control 17 so as to appropriately turn them on or off in conformity with the LEDs 18-1 to 18-4.

(4) Fourth Variation

Figure 9:
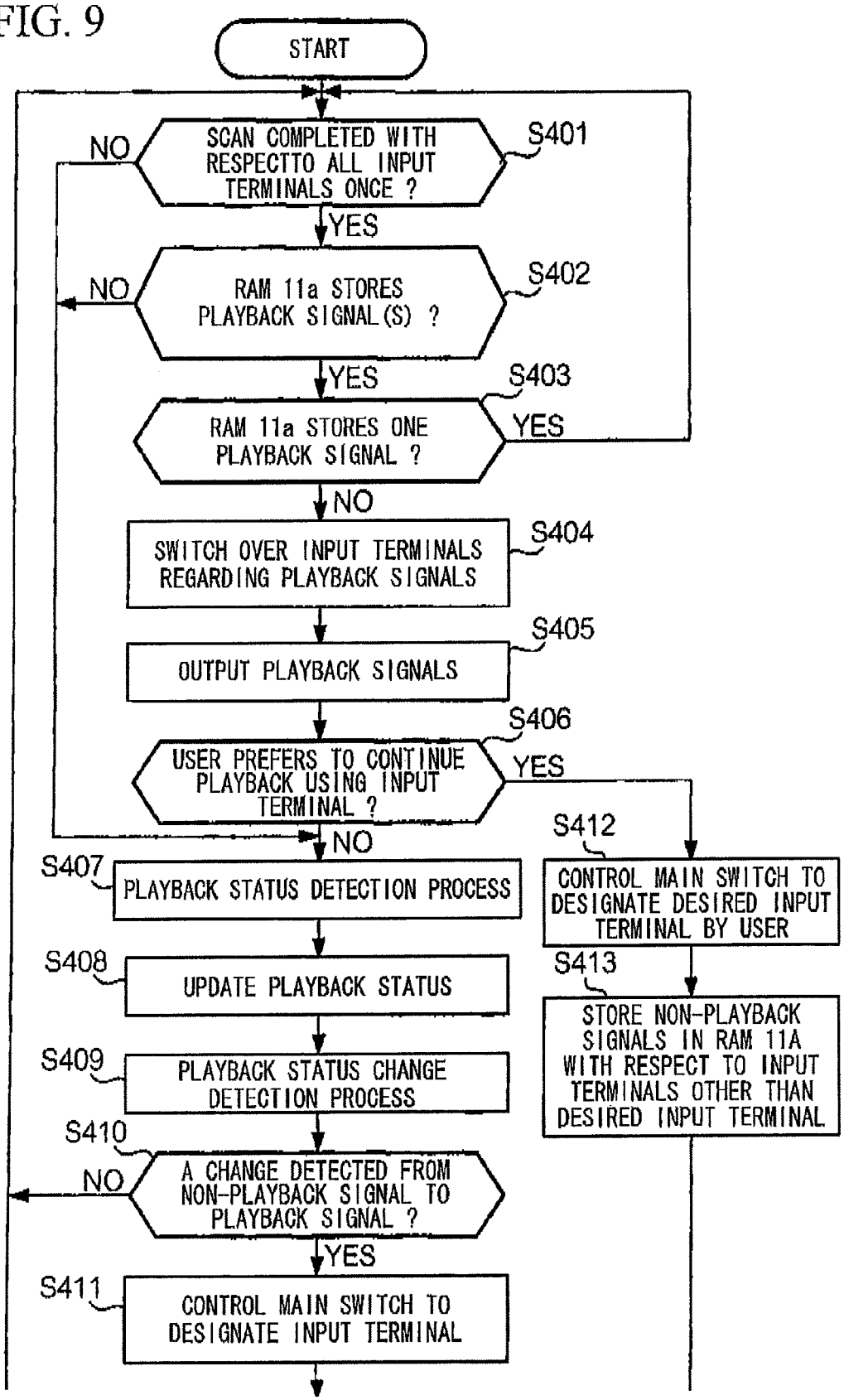
FIG. 9 is a flowchart showing a notification process of the amplifier device according to a fourth variation.

The present embodiment can be modified such that, during playback of multiple audio devices in progress, they are sequentially switched over so as to notify the user of the audio devices presently played back. FIG. 9 is a flowchart showing a notification process, wherein the controller 11 determines whether or not all the input terminals 12-1 to 12-4 are scanned once in step S401. When the decision result of step S401 is "NO" so that a scan is not completed with respect to all the input terminals 12-1 to 12-4 once, the flow proceeds to step S407 in which the controller 11 performs a playback status detection process on each of the input switches 12-1 to 12-4. In step S408, the controller 11 updates playback statuses with respect to each of the input switches 12-1 to 12-4. In step S409, the controller 11 performs a playback status change detection process with respect to each of the input switches 12-1 to 12-4. The detailed content of the playback status detection process of step S407 is identical to the foregoing steps S101 to S105 shown in FIG. 3. The detailed content of step S408 is identical to the foregoing steps S201 and S202 shown in FIG. 4. The detailed content of the playback status change detection process of step S409 is identical to the foregoing steps S203 and S204 shown in FIG. 4.

After completion of steps S407, S408, and S409, the flow proceeds to step S410 in which the controller 11 makes a decision as to whether or not a change from the non-playback signal to the playback signal is detected with respect to the scanned input terminal. When such a change is detected so that the decision result of step S410 is "YES", the flow proceeds to step S411 in which the controller 11 sends a switching signal to the main switch 13-1 so as to designate the scanned input terminal. Then, the flow returns back to step S401 so as to make the controller 11 scan the next input switch.

When no change is detected so that the decision result of step S410 is "NO", the controller 11 does not send a switching signal to the main switch 13-1, and the flow directly returns to step S401. When the controller 11 completely scans all the input switches 12-1 to 12-4 without detecting changes so that the decision result of step S401 turns to "YES", the flow proceeds to step S402 in which the controller 11 makes a decision, with reference to the stored content of the RAM 11a, as to whether or not a playback signal is given from any one of the input terminals 12-1 to 12-4. When no playback signal is given so that the decision result of step S402 is "NO", the flow proceeds to step S407 in which the controller 11 performs the playback status detection process.

When a playback signal is given from any one of the input terminals 12-1 to 12-4 so that the decision result of step S402 is "YES", the flow proceeds to step S403 in which the controller 11 counts the number of playback signals presently received. When the number is one, the decision result of step S403 is "YES"; that is, no playback signal is given from the input switches other than the input switch presently designated by the main switch 13-1. This indicates that the amplifier device 1 does not necessarily inquire the user as to a desired audio device that the user prefers to play back. Hence, the flow returns to step S401, and the controller 11 does not send a switching signal to the main switch 13-1.

When the number is two or more, the decision result of step S403 is "NO", indicating that another playback signal is given from another input terminal other than the input terminal presently designated by the main switch 13-1. The flow proceeds to step S404 in which the controller 11 controls the main switch 13-1 so as to sequentially designate each of the input terminals in a prescribed time (e.g. two seconds). In step S405, the main switch 13-1 sequentially outputs playback signals given from multiple audio devices. This makes it possible for the user to recognize the audio devices presently played back; hence, the user can determine whether to continue playback with regard to each input terminal. When the user designates a desired input terminal presently outputting a playback signal so that the decision result of step S406 is "YES", the flow proceeds to step S412 in which the controller 11 supplies a switching signal to the main switch 13-1 so as to designate the desired input terminal. In step S413, non-playback signals are stored in the RAM 11a with respect to other input terminals other than the desired input terminal.

Due to the aforementioned processing, while multiple audio devices are presently subjected to playback in progress, the amplifier 1 sequentially selects their audio signals in units of the prescribed time (e.g. two seconds) so as to notify the user of audio devices presently played back. This makes is possible for the user to recognize audio devices, which are connected to the amplifier device 1 and are presently played back; hence, the user can designate any one of audio devices while stopping other audio devices of which the user does not wish playback.

(5) Fifth Variation

The present embodiment and its variations are designed to cope with digital audio signals output from audio devices. Of course, they can be modified to cope with analog audio signals. This is realized by incorporating an A/D converter (for converting analog audio signals into digital audio signals) in the analyzer 14, which thus analyzes the signal Sa so as to make a determination as to whether input signals are digital audio signals or analog audio signals. Based on the determination result, the amplifier device 1 appropriately processes audio signals. When it is determined that digital audio signals are supplied to the amplifier device 1, the amplifier device 1 performs decoding suited to types of digital audio signals.

The amplifier device 1 can be connected to video devices in addition to audio devices. Since the aforementioned determination is performed based on audio signals, the analyzer 14 analyzes audio signals output from video devices connected to the audio device 1 so as to automatically select a desired video device. In this case, the audio device 1 is modified to appropriately select video signals output from video devices in interconnection with automatic selection of audio signals.

(6) Sixth Variation

The present embodiment is not designed to adjust volumes of audio signals; but this is not a restriction. That is, the amplifier device 1 can be modified to automatically adjust volumes of audio signals in association with automatic selection of audio signals output from audio devices. In this case, the analyzer 14 detects the level of the signal Sa so as to automatically calculate parameters indicating the volume based on the detection result. The controller 11 receives these parameters so as to control the amplifier 16 based on them. Thus, it is possible to produce sound based on audio signals with an appropriate volume.

(7) Seventh Variation

The present embodiment performs detection of noise with respect to hamming noise and oscillation noise; but this is not a restriction. The present embodiment can be modified to determine that input signals form noise when their frequency components are outside of the prescribed frequency range and to determine that input signals do not form noise when their frequency components lie within the prescribed frequency range.

Lastly, the present invention is not necessarily limited to the present embodiment and its variations, which can be further modified within the scope of the invention as defined in the appended claims.

What is claimed is:

1. A selector comprising:
a plurality of input terminals for receiving input signals;
a main switch, which switches over the input terminals so as to select one input terminal;
an analyzer, which analyzes the input signals given from the input terminals at respective timings so as to determine whether or not each of the input signals corresponds to a playback signal;
a storage for storing a plurality of determination results determined by the analyzer in connection with the plurality of input terminals; and
a controller, which compares a present determination result determined by the analyzer with a preceding determination result determined by the analyzer so that when the present determination result differs from the preceding determination result so as to indicate the input terminal whose input signal is newly determined as the playback signal, the main switch is controlled to select the input terminal.

2. A selector according to claim 1, wherein the analyzer performs frequency analysis on the input signals, so that the input signal including a specific frequency component having a high intensity is not determined as the playback signal and is regarded as noise.

3. A selector according to claim 1 further comprising a display for displaying the determination results with respect to the input terminals with reference to the storage under control of the controller, wherein the display shows a distinction with respect to the input terminal whose input signal is not determined as the playback signal.

4. A selector according to claim 2 further comprising a display for displaying the determination results with respect to the input terminals with reference to the storage under control of the controller, wherein the display shows a distinction with respect to the input terminal whose input signal is not determined as the playback signal.

5. A selector according to claim 1, wherein the main switch includes a plurality of delays for delaying the input signals with respect to the plurality of input terminals.

6. A selector according to claim 2, wherein the main switch includes a plurality of delays for delaying the input signals with respect to the plurality of input terminals.

7. A selector according to claim 3, wherein the main switch includes a plurality of delays for delaying the input signals with respect to the plurality of input terminals.

8. A selector according to claim 4, wherein the main switch includes a plurality of delays for delaying the input signals with respect to the plurality of input terminals.

9. The selector according to claim 1, further comprising:
an auxiliary switch connected to the plurality of input terminals and the analyzer, wherein the analyzer receives and analyzes the input signals from the auxiliary switch.

10. The selector according to claim 9, wherein the auxiliary switch is periodically switched between of the input signals and the analyzer analyzes the periodically switched input signals.

11. A method for operating a selector, comprising:
receiving, by a main switch, a plurality of input signals from a respective plurality of input terminals;
analyzing, by an analyzer, the input signals from the input terminals at respective periods of time to determine whether or not each of the input signals corresponds to a playback signal;
storing, by a storage, a plurality of determination results determined by the analyzer in connection with the plurality of input terminals; and
comparing, by a controller, a present determination result determined by the analyzer with a preceding determination result determined by the analyzer so that when the present determination result differs from the preceding determination result so as to indicate the input terminal whose input signal is newly determined as the playback signal, the main switch is controlled to select the input terminal.

12. The method according to claim 11, wherein the analyzer receives and analyzes the input signals from an auxiliary switch.

13. The method according to claim 12, further comprising:
delaying each of the plurality of input signals received by the main switch;
selecting, by the main switch, one of the delayed plurality of input signals; and
outputting, by the main switch, the selected, delayed plurality one of the plurality of input signals.

* * * * *